United States Patent
Seo (10) Patent No.: US 9,423,836 B2
(45) Date of Patent: Aug. 23, 2016

(54) SUPER-SLIM TOUCH KEYBOARD AND SUPER-SLIM COVER DEVICE FOR SMART KEYBOARD HAVING THE SAME

(71) Applicant: WooRin Corporation, Seongnam-si, Gyeonggi-do (KR)

(72) Inventor: Jae Hong Seo, Seongnam-si (KR)

(73) Assignee: WOORIN CORPORATION, Seongnam-Si, Gyeonggi-Do (KR)

( * ) Notice: Subject to any disclaimer, the term of this patent is extended or adjusted under 35 U.S.C. 154(b) by 21 days.

(21) Appl. No.: 14/622,030

(22) Filed: Feb. 13, 2015

(65) Prior Publication Data

US 2015/0338886 A1    Nov. 26, 2015

(30) Foreign Application Priority Data

May 23, 2014 (KR) .......................... 10-2014-0062329
Aug. 20, 2014 (KR) .......................... 10-2014-0108364

(51) Int. Cl.
*G06F 1/16* (2006.01)

(52) U.S. Cl.
CPC ................ *G06F 1/1662* (2013.01); *G06F 1/16* (2013.01)

(58) Field of Classification Search
CPC ............ G11C 7/22; G06F 3/044; G09G 5/00; H05K 7/20
USPC ........... 455/573, 411, 572, 343.1, 557, 550.1, 455/575.3; 365/189.5, 191, 51; 345/174, 345/156, 178, 633, 169, 168, 634; 174/256, 174/260, 262
See application file for complete search history.

(56) References Cited

U.S. PATENT DOCUMENTS

| | | | | |
|---|---|---|---|---|
| 6,781,819 | B2 * | 8/2004 | Yang ........................ | G06F 1/162 341/22 |
| 2007/0089311 | A1 * | 4/2007 | Amundson ............ | G01C 17/28 33/355 R |
| 2015/0190107 | A1 * | 7/2015 | Kim ........................ | A61B 5/055 600/410 |

* cited by examiner

*Primary Examiner* — Hung Duong
(74) *Attorney, Agent, or Firm* — Rabin & Berdo, P.C.

(57) ABSTRACT

A super-slim touch keyboard and a super-slim smart cover device including the same are provided. The super-slim touch keyboard includes a lower case, a touch circuit board including a key pattern disposed on the lower case and a touch wheel pattern disposed adjacent to the key pattern, a piezoelectric sensor film layer formed on the touch circuit board and including a piezoelectric sensor printed on a portion thereof corresponding to the key pattern, an electro-luminance (EL) film layer formed on the piezoelectric sensor film layer, a keypad layer formed on the EL film layer and including a plurality of keys at a portion thereof corresponding to the key pattern, and an upper case disposed to be coupled to the lower case at a periphery of the keypad layer and including a touch wheel at a portion thereof corresponding to the touch wheel pattern.

15 Claims, 12 Drawing Sheets

SUPER-SLIM TOUCH KEYBOARD AND SUPER-SLIM COVER DEVICE FOR SMART KEYBOARD HAVING THE SAME

CROSS-REFERENCE TO RELATED APPLICATION

This application claims priority to and the benefit of Korean Patent Applications No. 2014-0062329, filed on May 23, 2014 and No. 2014-0108364, filed on Aug. 20, 2014, the disclosure of which is incorporated herein by reference in its entirety.

BACKGROUND

1. Field of the Invention

The present invention relates to a super-slim touch keyboard for a tablet PC and a super-slim smart cover device mounting a mobile terminal and serving as a keyboard.

2. Discussion of Related Art

A keyboard is an input device of a computer system and configured with letters, numbers, special characters, and function keys. The number of keys on the keyboards is currently increasing according to users' demand for function expansion, and, in general, a total of about 100 keys on the keyboards are used.

The function keys may include Ctrl, Alt, Shift, Enter, and Tab, which are used for the purpose of changing an original meaning of a key, controlling program operation, or moving text or cursor on the monitor.

An operating mechanism of the keyboard is classified into a mechanical operation and electronic operation according to a method of flowing currents. In the electronic operation, when a key is pressed, a spring in the key is compressed, then the amount of charge flowing through a circuit connected to the key is decreased, and the circuit identifies the status of a key press by measuring the amount of charge flowing through the current. In the mechanical operation, when a key is pressed, currents flows by two metals being attached and detached and the circuit identifies the status of a key press by determining whether the current flows or not.

However, such electronic and mechanical keyboards may not be suitable to use in a notebook PC or related products, which have recently become slimmer.

Meanwhile, a mobile terminal basically functions as a telephone performing voice or video communication with the other parties while a user thereof always carries it. In addition, the mobile terminal may provide a variety of functions, such as a camera function, a video player function, a schedule management function, an information search function using a wireless internet, and a gaming function.

In normal mobile terminals, various key buttons may be provided for users to select a specific item or input numbers or letters.

Recently, as a data processing speed and a storage capacity of a mobile terminal have been enhanced, there is a limit in that the mobile terminal accommodates various functions the users require with only the key buttons installed therein.

Mobile terminals, such as iPad® or Galaxy tab®, recently being commercialized, are thin, a rear side thereof is protected by an aluminum case, and a front side thereof is used as a display portion. In addition, a support configured to protect the display portion and support the display portion in an upright position is commercially available.

However, since such a support simply supports the mobile terminal, and does not function as a keyboard, the portable terminal may be used only for an audiovisual purpose, and thus input functions may be reduced.

SUMMARY OF THE INVENTION

The present invention is directed to a super-slim touch keyboard for tablet PC, which includes a keyboard formed to be ultra-thin and ultra-light and has superior portability.

The present invention is also directed to a super-slim smart keyboard cover device directly accommodating a mobile terminal and thin-film type keyboard in each cover thereof to implement a super-slim thickness, and performs keyboard functions while mounting the mobile terminal by opening a cover thereof according to a user's purpose.

According to an aspect of the present invention, there is provided a super-slim touch keyboard including a lower case, a touch circuit board including a key pattern disposed on the lower case and a touch wheel pattern disposed adjacent to the key pattern, a piezoelectric sensor film layer formed on the touch circuit board and including a piezoelectric sensor printed on a portion thereof corresponding to the key pattern, an electro-luminance (EL) film layer formed on the piezoelectric sensor film layer, a keypad layer formed on the EL film layer and including a plurality of keys at a portion thereof corresponding to the key pattern, and an upper case disposed to be coupled to the lower case at a periphery of the keypad layer and including a touch wheel at a portion thereof corresponding to the touch wheel pattern. The piezoelectric sensor includes an elastic part formed in a dome shape, and configured to be deformed and restored according to a pressure applied to the plurality of keys, a sensing part formed below the elastic part and configured to sense the pressure applied to the plurality of keys, and a vibrating part disposed in a periphery of the elastic part and configured to vibrate when sensing a pressure applied to the plurality of keys.

According to another aspect of the present invention, there is provided a super-slim smart keyboard cover device including a keyboard configured to perform wired/wireless communication with a mobile terminal and input information to the mobile terminal, a first cover including the mobile terminal on one surface thereof, a second cover pivotably connected to the first cover and accommodating the keyboard, and a support foldably formed on the other surface opposite to the one surface of the first cover and configured to lift and support the mobile terminal in a predetermined angle. The support is formed on the other surface of the first cover in a direction perpendicular to a longitudinal direction of the first cover, and includes a center region and first and second regions respectively extending upwardly and downwardly from the center region. A guiding part configured to move the support is formed on the other surface of the first cover. A magnetic material is disposed inside portions of the guiding part corresponding to the first region, the second region, and the center region.

BRIEF DESCRIPTION OF THE DRAWINGS

The above and other objects, features, and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Exemplary embodiments of the present invention will be described in detail below with reference to the accompanying drawings. While the present invention is shown and described in connection with exemplary embodiments thereof, it will be apparent to those skilled in the art that various modifications can be made without departing from the spirit and scope of the invention.

Figure 1A:
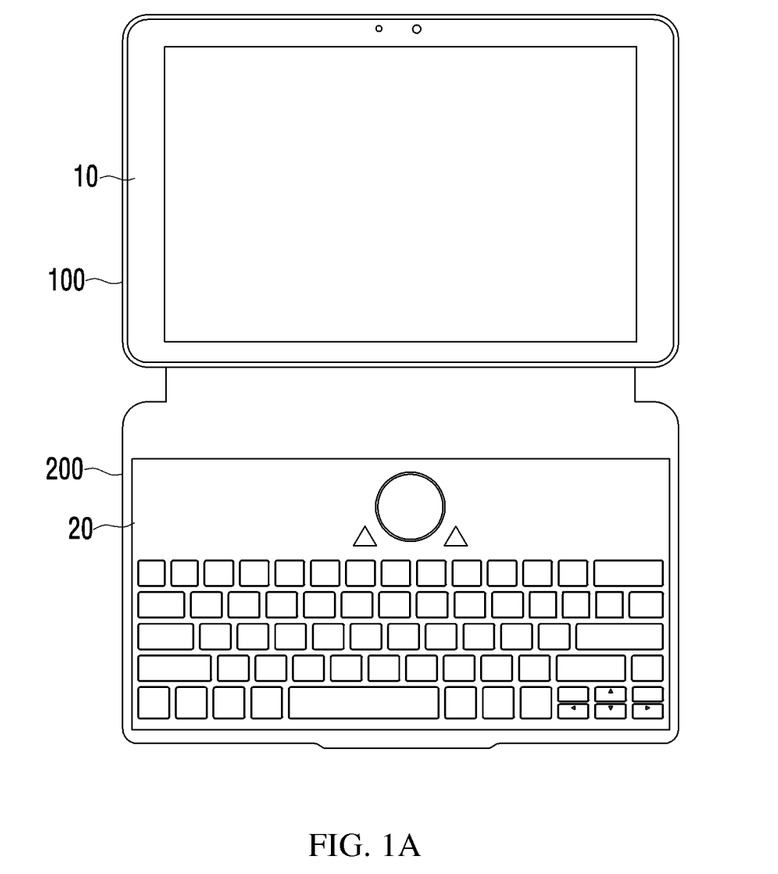
FIGS. 1A to 1C are diagrams illustrating a super-slim smart keyboard cover device according to an embodiment of the present invention.
Figure 1B:
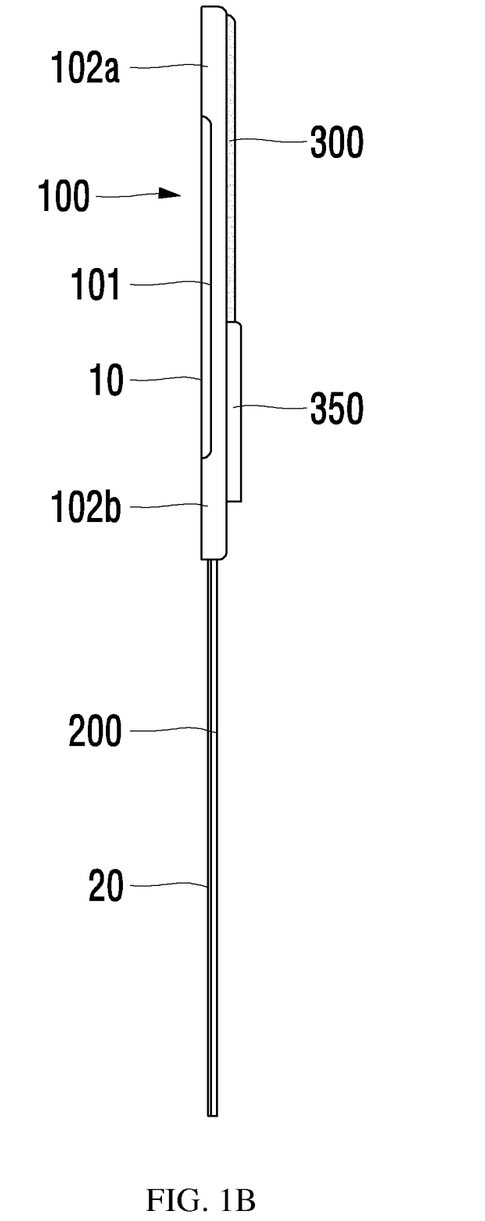
Figure 1C:
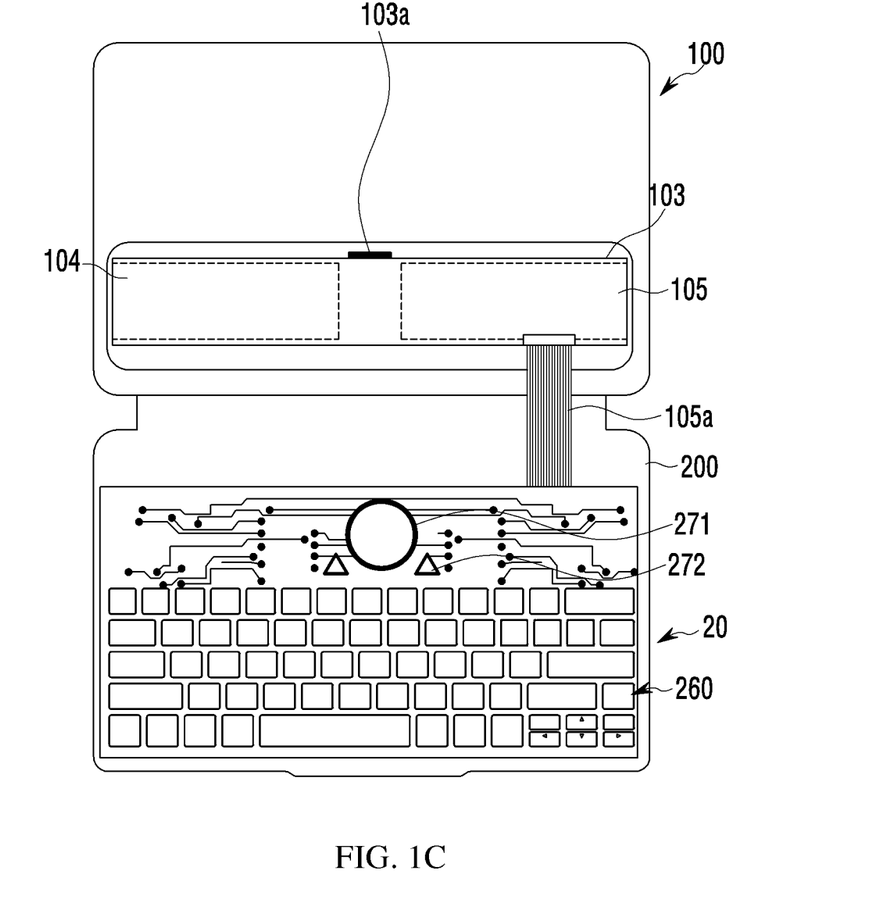
Figure 2:
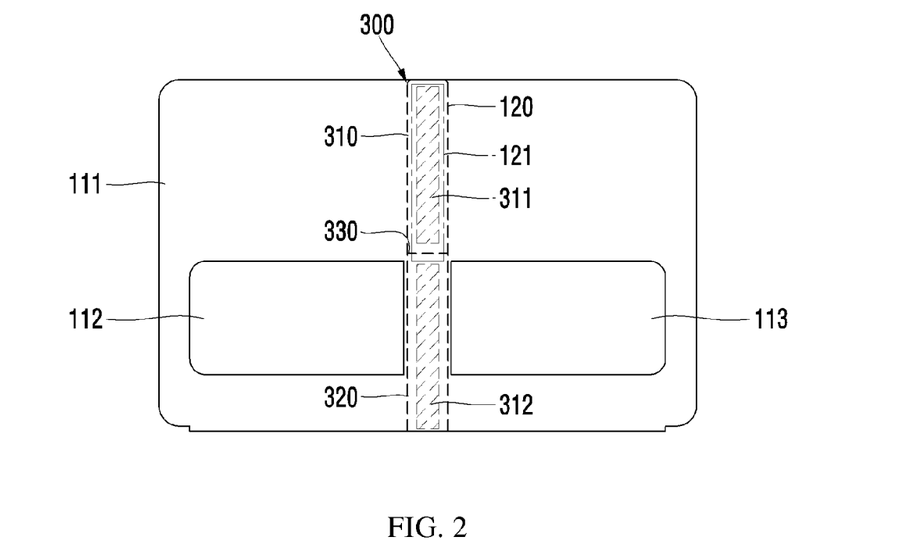
FIG. 2 is a diagram illustrating a rear side of a first cover of a super-slim smart keyboard cover device according to an embodiment of the present invention.
Figure 3:
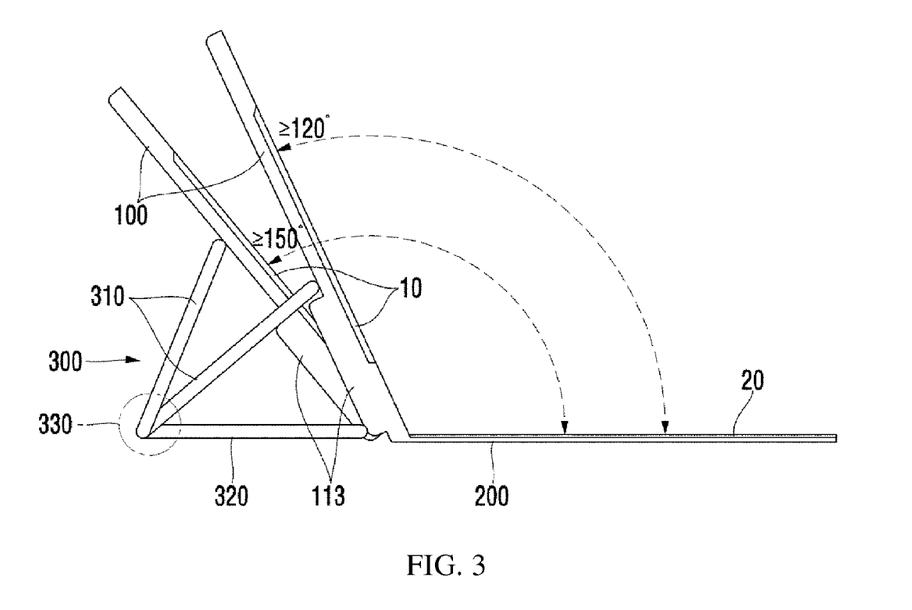
FIG. 3 is a side view illustrating a state in which a super-slim smart keyboard cover device according to an embodiment of the present invention is upright.
Figure 4:
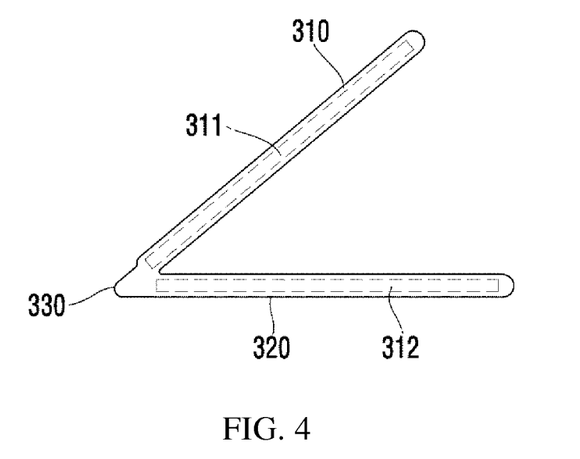
FIG. 4 is a diagram illustrating a support of FIG. 3.

FIGS. 1A to 1C are diagrams illustrating a super-slim smart keyboard cover device according to an embodiment of the present invention, and FIG. 2 is a diagram illustrating a rear side of a first cover of a super-slim smart keyboard cover device according to an embodiment of the present invention. FIG. 3 is a side view illustrating a state in which a super-slim smart keyboard cover device according to an embodiment of the present invention is upright, and FIG. 4 is a diagram illustrating a support of FIG. 3.

Referring to FIGS. 1A to 2, a super-slim smart keyboard cover device 1 according to an embodiment of the present invention includes a first cover 100 and a second cover 200 respectively combined with a mobile terminal 10 and a super-slim touch keyboard 20, and a support 300 coupled to the first cover 100. The first cover 100 and the second cover 200 may cover rear sides of the mobile terminal 10 and the super-slim touch keyboard 20 and may be connected to each other. In addition, when the mobile terminal 10 or the super-slim touch keyboard 20 is not used, the first cover 100 and the second cover 200 may be kept folded to face each other, and when the mobile terminal 10 or the super-slim touch keyboard 20 is being used, the first cover 100 covering the rear side of the mobile terminal 10 is supported by the support 300 unfolded upwardly.

The mobile terminal 10 may include a variety of mobile terminals such as a tablet PC. The tablet PC may be not only a personal computer which does not include a keyboard or a mouse and is mainly operated using a touchscreen, but also a personal computer including an interfacing means to which a keyboard is connected for convenience of use and operation. The mobile terminal 10 may be, for example, Samsung's Galaxy Tab, Apple's iPad, Identity tab®, RIM's Blackberry Playbook®, Hewlett-Packard's Slate®, Toshiba's Folio 100, Asus' Eeepad, i-station Z3D, or LG's Optimus Pad, but is not limited thereto.

The super-slim touch keyboard 20 is a tablet keyboard paired with the mobile terminal 10, performs wired/wireless communication with the mobile terminal 10, and functions to input information to the mobile terminal 10. The super-slim touch keyboard 20 and the mobile terminal 10 may perform data communication by Bluetooth, but are not limited thereto. The super-slim touch keyboard 20 and the mobile terminal 10 may perform data communication using various well-known methods of short-range wired/wireless communication technology.

The super-slim touch keyboard 20 may be combined with the second cover 200. That is, the super-slim touch keyboard 20 may be fixidly combined with a fixing sidewall (not shown) formed in a side portion of the second cover 200. Here, the fixing sidewall may be formed one of a rubber material, a spring, and silicone.

The first cover 100 may function to cover and protect a rear side of mobile terminal 10. The mobile terminal 10 may be combined with one surface 101, and a guide 120 along which the support 300 moves may be formed on the other surface 102 opposite to the one surface 101. A magnetic material 121 may be disposed inside the guide 120. Here, the magnetic material 121 disposed inside the guide 120 may be formed to have various shapes and lengths depending on structures and lengths of magnetic materials 311 and 312 respectively disposed inside a first region 310 and a second region 320 which configure a support 300.

In addition, fastening projections 102a and 102b are formed to extend from the one surface 101 of the first cover 100 (that is, in a forward direction) in sides of the one surface 101 of the first cover 100 so that the mobile terminal 10 is fitted thereinto. The fastening projections 102a and 102b may be formed in edges of the one surface 101 of the first cover 100, but positions of the fastening projections 102a and 102b according to embodiments of the present invention are not limited thereto. A plurality of fastening projections 102a and 102b may be formed in sides as well as the corners. Accordingly, the mobile terminal 10 may be fixidly combined by the fastening projections 102a and 102b formed on the sides of the first cover 100. Here, the fastening projections 102a and 102b may be formed of one of rubber, a spring, and silicone.

The second cover 200 may function to cover and protect a rear side of the keyboard 20 and may be connected to the first cover 100, wherein a portion connected to the first cover 100 may be foldable. The super-slim touch keyboard 20 may be combined with a surface, which faces the first cover 100 when folded, of the second cover 200. The super-slim touch keyboard 20 may be fixidly combined with the second cover 200 by a fastening sidewall (not shown) formed in sides of the second cover 200. The fastening sidewall may be formed on the second cover 200 similarly as the fastening projections 102a and 102b of the first cover 100.

Meanwhile, the first cover 100 and the second cover 200 may be formed of a hard material, such as a plastic or aluminum, but are not limited thereto.

The support 300 may be foldably formed on the other surface 102 of the first cover 100, which is a surface opposite to the one surface 101, and lift the mobile terminal 10 in a predetermined angle and support it. The support 300 may be formed on the other surface 102 of the first cover 100 in a direction perpendicular to a longitudinal direction of the first cover 100.

The support 300 may include a center region 330, and the first region 310 and the second region 320 respectively extending upwardly and downwardly with respect to the center region 330. Here, the first region 310 and the second region 320 may have approximately the same length.

The support 300 configured as described above is folded at the center region 330 in a direction distanced from the first cover 100, as illustrated in FIGS. 3 and 4, and operated in such a manner that an end portion of the first region 310, opposite to the center region 330, is in contact with the other surface 102 of the first cover 100. In order to implement such an operation, the magnetic materials 311, 312 may be disposed at inside areas of the guide 120 corresponding to the first region 310 and the center region 330.

More specifically, when a user applies a certain force to fold the center region 330 in a direction distanced from the first cover 100 (that is, in a backward direction of the first cover 100), a magnetic material 311 of the first region 310 in the support 300 may become in contact with a magnetic material 121 of the guide 120 of the first cover 100 by their magnetic properties. Here, the second region 320 may be supported by contact with the ground. In addition, an end portion of the second region 320 in a direction distanced from the center region 330 may be formed to be connected to or in contact with the one surface 101 of the first cover 100. The mobile terminal 10 disposed on first cover 100 may be lifted in a predetermined angle with respect to the ground by such an operation of the support 300. Here, the predetermined angle is an angle formed between the one surface 101 of the first cover 100, and the second cover 200. The predetermined angle may be in the range of 120 degrees to 150 degrees. Such a range of the angle was determined in repeated experiments in which a user works in front of the mobile terminal 10 while maintaining a state in which mobile terminal 10 does not fall backwards. It was found that the angle in the range of 120 degrees to 150 degrees may be applied to any type of the mobile terminal 10. More specifically, if the predetermined angle is smaller than 120 degrees, the support 300 may not support the first cover 100 since the end portion of the first region 310 is not in contact with the guide 120 of the first cover 10 when the center region 330 of the support 300 is folded. In addition, if the predetermined angle is greater than 150 degrees, the support 300 may not sufficiently support the first cover 100 due to the load of the first cover 100 and the mobile terminal 10 even when the center region 330 of the support 300 is folded and the end portion of the first region 310 is in contact with the guide 120 of the first cover 10.

In addition, a width in a direction perpendicular to the longitudinal direction of the magnetic material 121 disposed inside the guide 120 may be greater than widths in a direction perpendicular to the longitudinal direction of the magnetic materials 311 and 312 disposed inside the first region 310 and the second region 320. Accordingly, when the support 300 is folded, a magnetic material 311 or 312 disposed at the end portion of the first region 310 or an end portion of the second region 320 may be easily in contact with the magnetic material 121 disposed inside the guide 120.

Selectively, the magnetic material 121 disposed inside the guide 120 may be preferably arranged to be parallel to a side of a housing groove 103 disposed at the center region 330 and having an end portion perpendicular to the longitudinal direction thereof being disposed adjacent to the center region 330. That is, the magnetic material 121 disposed inside the guide 120 may have a length corresponding to a length of the first region 310 and a portion of the second region 320 adjacent to first region 310 Accordingly, the effect of the magnetic material 121 disposed inside the guide 120 on an electrical connection between a battery 104 embedded in the housing groove 103 and a printed circuit board (PCB) 105 may be minimized The first region 310 and the second region 320 may be formed by injection molding using a natural resin and a synthetic resin or formed of a lightweight metal such as aluminum, but materials forming the first region 310 and the second region 320 according to the embodiment of the present invention are not limited thereto. Here, when the first region 310 and the second region 320 is formed of a metal such as aluminum, an electroplating material (not shown) for preventing corrosion may be formed on outer surfaces of the first region 310 and the second region 320.

The housing groove 103 which accommodates the battery 104 and the PCB 105, and an auxiliary cover 350 including a hook 103a opening and closing a top of the housing groove 103 may be formed in a lower portion of the one surface 101 of the first cover 100. A fastening unit (not shown) to be coupled to the hook 103a disposed on the auxiliary cover 350 may be formed in a portion of an edge area of the housing groove 103. In addition, the battery 104 may be electrically connected to the PCB 105 inside the housing groove 103, and the PCB 105 may be electrically connected to a flexible printed circuit board (FPCB, not shown) disposed in the super-slim touch keyboard 20 through a connection interface member 105a.

The battery 104 may be a secondary battery, such as a lithium polymer battery, which has several to several tens of hours of use with a single charge.

In addition, a Bluetooth communication module (not shown) for communicating with the FPCB, a plurality of keys, a control module (not shown) controlling operations of a touch wheel (that is, a wheel 271 and a rotating mouse formed at both sides of the wheel 271) may be disposed on the PCB 105.

The housing groove 103 may be formed to protrude convexly toward the other surface 102 of the first cover 100 in left and right directions with respect to the second region 320. That is, the housing groove 103 may include a first housing groove (not shown) and a second housing groove (not shown). The first housing groove (not shown) and the second housing groove may be concavely formed in the one surface 101 of the first cover 100 so as to correspond to each other with respect to the second region 320, and respectively accommodate the battery 104 and the PCB 105 thereinside.

The auxiliary cover 350 may include the hook 103a on a portion corresponding to the fastening unit (not shown) disposed on the housing groove 103 so as to open and close the top of the housing groove 103. Accordingly, when an error occurs in the battery 104 or the PCB 105 embedded in the housing groove 103, replacement or repair thereof may be facilitated.

The super-slim smart keyboard cover device according to the embodiment of the present invention may achieve a super-slim thickness by accommodating the mobile terminal 10 and the super-slim touch keyboard 20 thereinside, and allow for the keyboard 20 to perform its own function while mounting the mobile terminal 10 when a user opens the first cover 100 as needed.

Figure 5A:
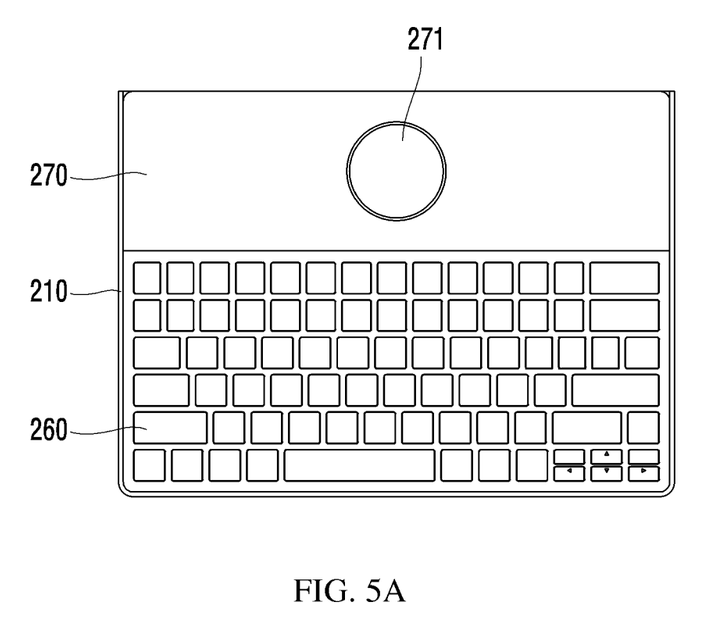
FIG. 5A is a front view illustrating a super-slim touch keyboard according to another embodiment of the present invention.
Figure 5B:
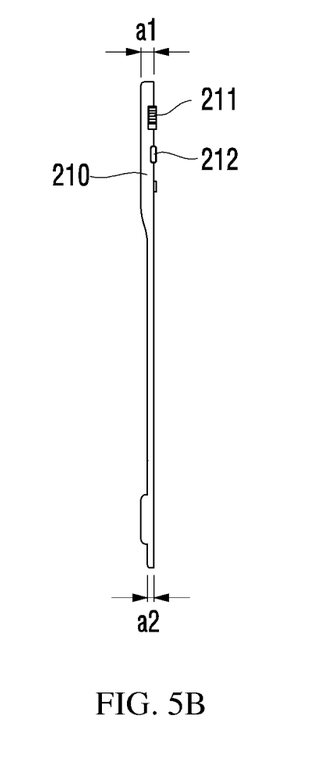
FIG. 5B is a side view illustrating the super-slim touch keyboard according to another embodiment of the present invention.
Figure 6:
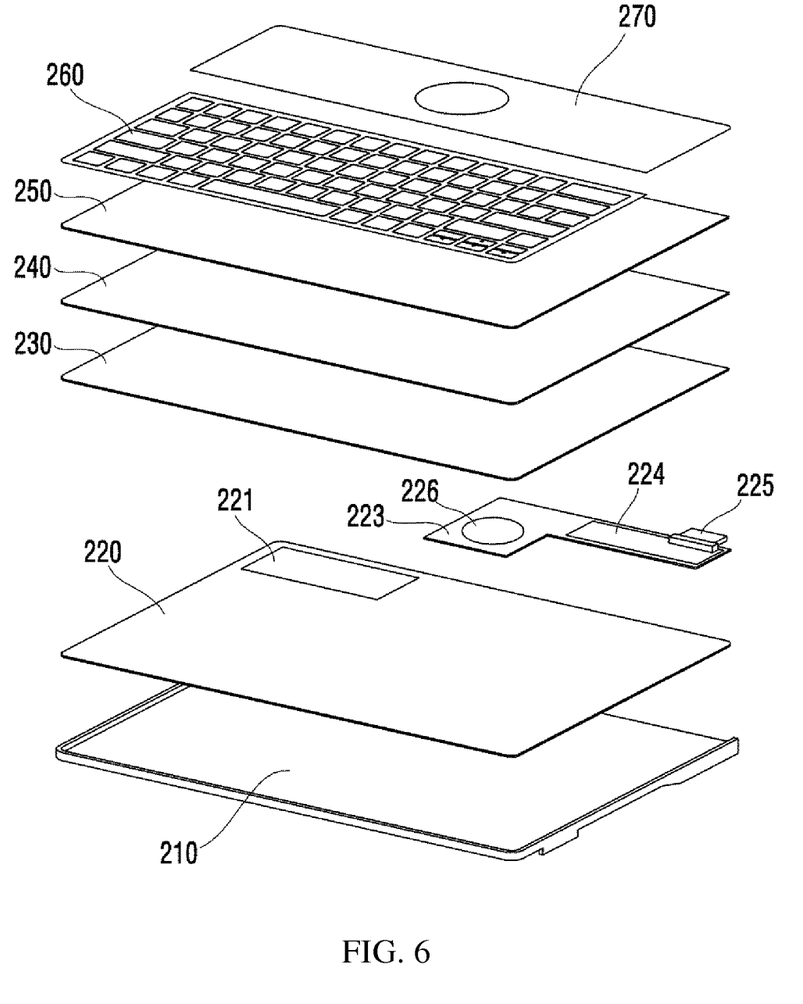
FIG. 6 is an exploded perspective view of a super-slim touch keyboard according to another embodiment of the present invention.
Figure 7:
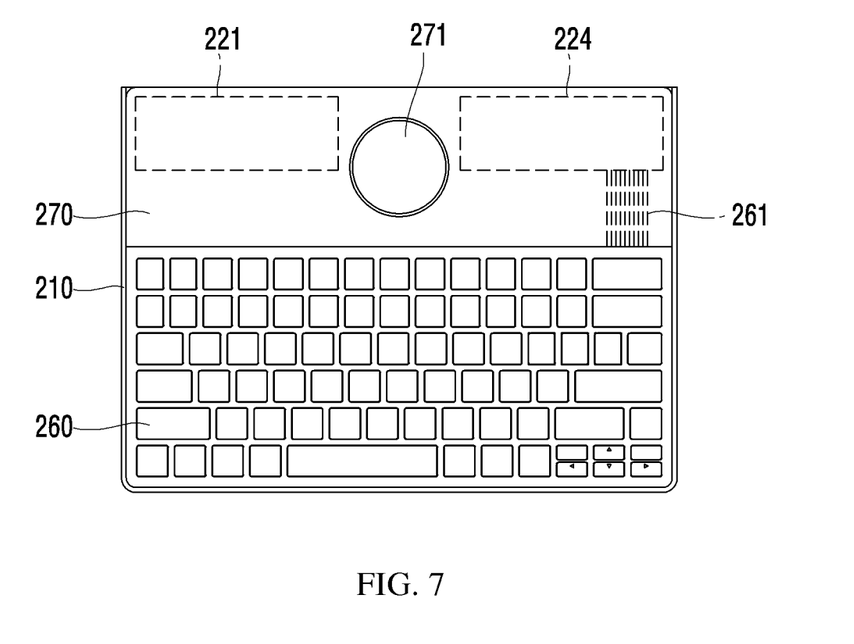
FIG. 7 is an inside view of the super-slim touch keyboard according to another embodiment of the present invention.
Figure 8A:
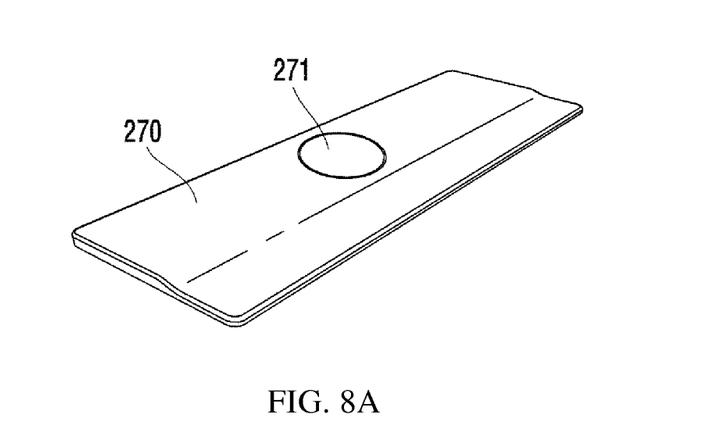
FIGS. 8A to 8C are diagrams illustrating components of a super-slim touch keyboard according to another embodiment of the present invention.
Figure 8B:
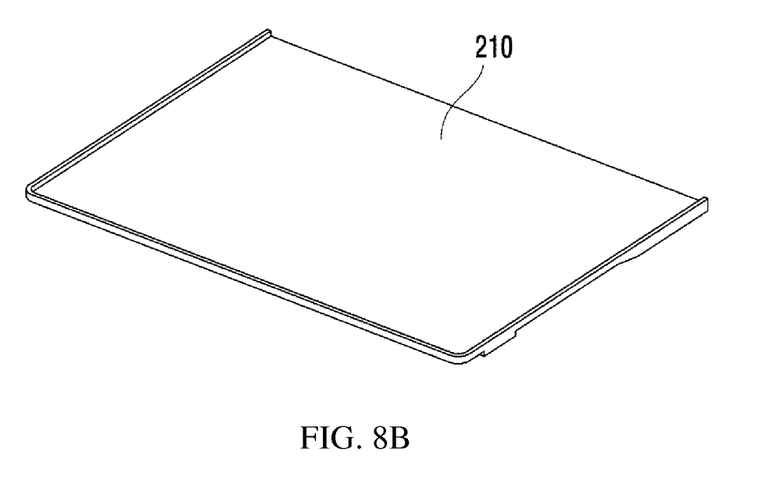
Figure 8C:
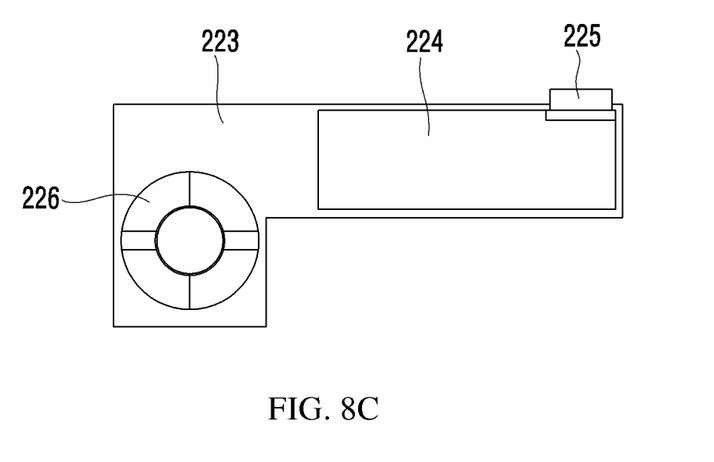
Figure 9A:
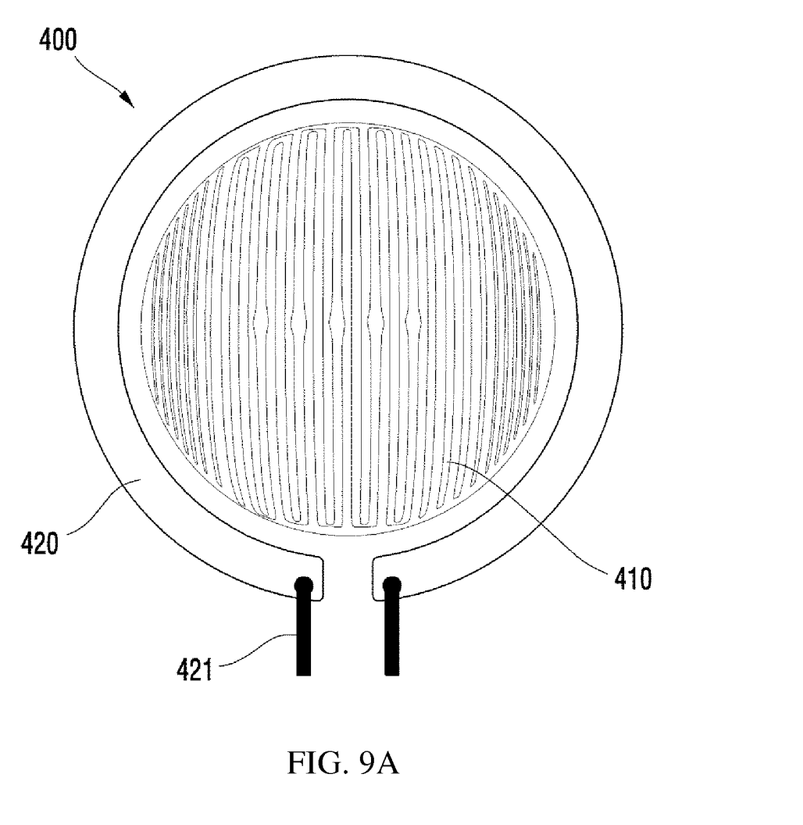
FIGS. 9A to 9C are diagrams illustrating a structure of a piezoelectric sensor of a piezoelectric sensor film layer illustrated in FIG. 6.
Figure 9B:
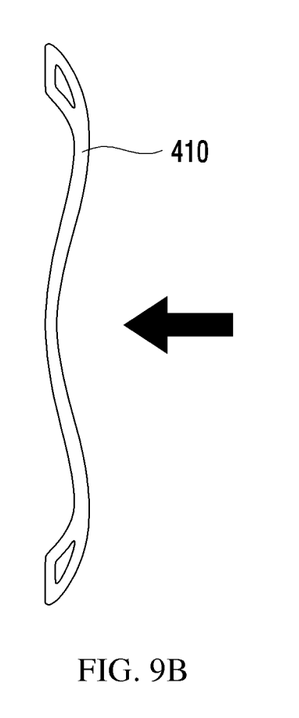
Figure 9C:
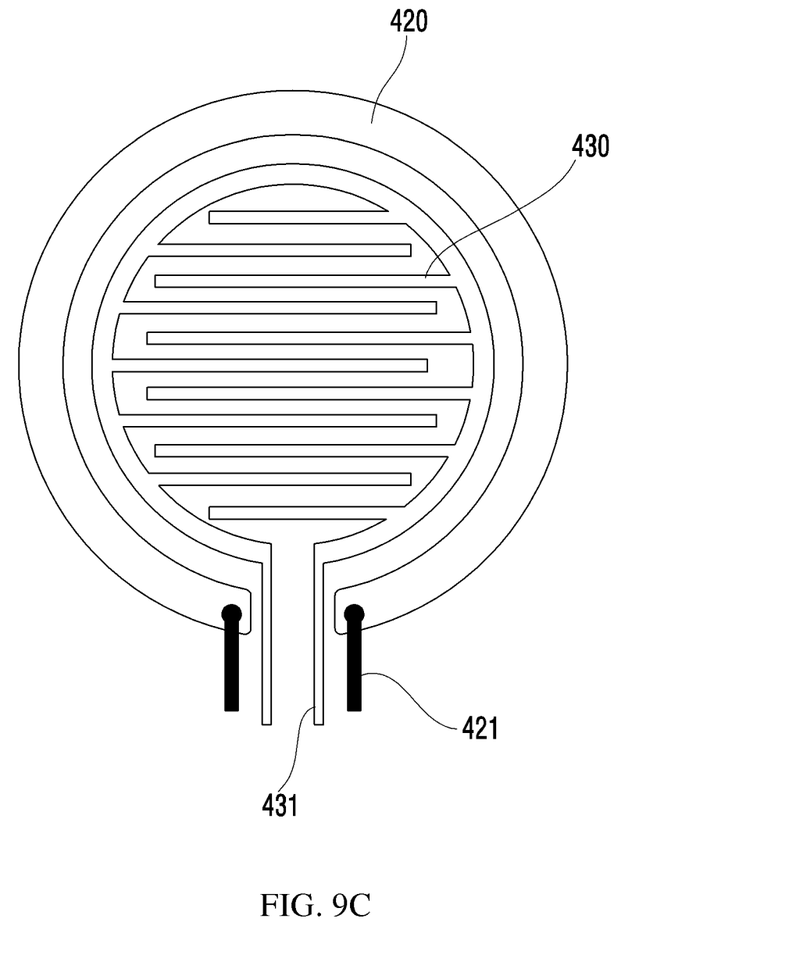

FIG. 5A is a front view illustrating a super-slim touch keyboard according to another embodiment of the present invention, and FIG. 5B is a side view illustrating the super-slim touch keyboard according to the embodiment of the present invention. FIG. 6 is an exploded perspective view of the super-slim touch keyboard according to the embodiment of the present invention, and FIG. 7 is an inside view of the super-slim touch keyboard according to the embodiment of the present invention. FIGS. 8A to 8C are diagrams illustrating components of a super-slim touch keyboard according to the embodiment of the present invention, and FIGS. 9A to 9C are diagrams illustrating a structure of a piezoelectric sensor of a piezoelectric sensor film layer illustrated in FIG. 6.

Referring to FIGS. 5A to 7, a super-slim touch keyboard 20 according to another embodiment of the present invention is a stand-alone portable keyboard detachably applied to a tablet PC, and includes a lower case 210, a touch circuit board 220, a piezoelectric sensor film layer 230, an actuator film layer 240, an EL film layer 250, a keypad layer 260, and an upper case 270.

Here, the tablet PC, to which the super-slim touch keyboard according to the embodiment of the present invention is applied, may refer to not only a personal computer mainly operated using a touch screen without using a keyboard or a mouse, but also a variety of personal computers with interfacing means, to which a keyboard may be connected for convenience of use and operation.

The lower case 210 may be, as illustrated in FIG. 8B, disposed on a bottom of the super-slim touch keyboard. The touch circuit board 220, the piezoelectric sensor film layer 230, the EL film layer 250, the actuator film layer 240, the keypad layer 260, and the upper case 270, which are disposed on the lower case 210, may be fixidly combined with the lower case 210 using a fastening sidewall (not shown). In addition, a USB terminal 211 and a power terminal 212 may be disposed in a side portion of the lower case 210.

The lower case 210 may be formed of a hard material, such as a plastic or aluminum, to have a thickness of about 0.3 mm, but a material of the lower case 210 is not limited thereto. As illustrated in FIG. 5B, the lower case 210 may be formed to have a thickness a1 of about 5.0 mm at a portion combined with the upper case 270 and a thickness a2 of about 2.5 mm at a portion in which the keypad layer 260 is disposed. In order to compensate for a difference in the thicknesses between the two portions, a stopper (not shown) with a thickness of about 1.0 nm may be formed at both side portions of the lower case 210

The touch circuit board 220 may be disposed on the lower case 210, and include key patterns and a touch wheel pattern 226 disposed adjacent to the key patterns. More specifically, the touch circuit board 220 may include a battery 221, a PCB 222, an FPCB 223, a control circuit 224, and a communication interface 225.

The battery 221 is a device supplying power to drive the super-slim touch keyboard, and may be a secondary battery, such as a lithium polymer battery, charged by an external power source. However, a type of the battery 221 may not be limited by the present invention.

The PCB 222 may include the key patterns, recognize a signal generated from a plurality of keys, and output a keyboard value corresponding thereto. Here, the key patterns of the PCB 222 may be formed to correspond to the plurality of keys disposed on the keypad layer 260, and electrically connected to the FPCB 223 through an FPCB connector 261. The PCB 222 may be implemented in a single layer or two layers on an epoxy film. According to the embodiment of the present invention, the key patterns of the PCB 222 may be preferably formed to have a thickness of 0.1 mm or less in order to reduce errors in values extracted by a piezoelectric sensor 400, generated depending on locations at which pressing forces are randomly applied on the piezoelectric sensor film layer 230 disposed on the PCB 222.

The FPCB 223 may be formed on a portion of the PCB 222 to include the touch wheel pattern 226 having a circular shape as illustrated in FIG. 8C, recognize a signal generated in a touch wheel 271, and output a wheel value corresponding thereto. For this, the FPCB 223 may include the touch wheel pattern 226 and a touch sensor (not shown) sensing a signal generated from the touch wheel pattern 226.

For example, the touch wheel pattern 226 may include a power slide switch, a pairing push switch, a USB terminal jack, an FPCB connector, and a plurality of LEDs. The FPCB 223 may be formed in a thickness of about 0.3 mm to 0.8 mm using an SMT technique or a soldering technique.

The control circuit 224 is a microcontroller formed on the FPCB 223, and is electrically connected to the battery 221, the PCB 222, and the FPCB 223 to control operations of the plurality of keys and the touch wheel 271. The control circuit 224 may include a 16-channel ADC device (not shown) and support multi-keys for controlling the plurality of keys and the touch wheel 271. Although not shown in the drawings, the control circuit 224 may control operations of the plurality of LEDs (not shown) formed on the upper case 270. For example, the control circuit 224 may indicate a power on/off state, a battery charge status, a USB storage status, a communication state, a level of key sensitivity, or the like, using the plurality of LEDs. In addition, the control circuit 224 may generate control signals for menu movements, mouse or cursor movements, or Internet access, or document work by rotation of the touch wheel 271 clockwise or counterclockwise.

The communication interface 225 may be formed on the FPCB 223, electrically connected to the control circuit 224 to transmit/receive data to/from an external apparatus, that is, the tablet PC. For example, the communication interface 225 may be implemented as a Bluetooth chip for short-range communication.

The piezoelectric sensor film layer 230 is a film formed on the touch circuit board 220 and including a plurality of piezoelectric sensors 400 printed on portions thereof corresponding to the key patterns. The piezoelectric sensor film layer 230 may be formed of a printed polyvinylidene fluoride (PVDF).

Meanwhile, the piezoelectric sensor 400 is a device that typically very irregularly emits a very weak voltage in a range of 0.02 V to 0.07 V at the time of a very short impact. According to the embodiment of the present invention, a variation in voltages emitted from the piezoelectric sensor 400 may be reduced by forming the piezoelectric sensor 400 with a thickness of about 0.01 mm using a printing technique in consideration of such characteristics of the piezoelectric sensor 400.

The piezoelectric sensor 400 may include, as illustrated in FIG. 9A, an elastic part 410, a sensing part 430, and a vibrating part 420. According to the embodiment of the present invention, the piezoelectric sensor 400 is exemplarily formed in a circular shape, but is not limited thereto. The piezoelectric sensor 400 may be formed in a polygonal shape as well as the circular shape.

The elastic part 410, as illustrated in FIG. 9B, is a device having elasticity and may be formed in a dome shape to be deformed and restored according to a pressure applied to the plurality of keys through a finger of a user. The elastic part 410 may be formed of a silicone gel. The elastic part 410 may have a height of about 0.7 mm to 1 mm.

The sensing part 430, as illustrated in FIG. 9C, is a device formed below the elastic part 410 and detecting a pressure applied to the plurality of keys. The sensing part 430 may detect a pressure signal applied to the plurality of keys and apply the signal to the control circuit 224 connected via a second conductive line 431. The signal amplified by the control circuit 224 may be transmitted to the vibrating part 420. Here, the sensing part 430 may preferably have a response time of 50 ms or less.

The vibrating part 420 is a device formed in the periphery of the elastic part 410 and vibrating when a pressure applied to the plurality of keys is detected. The vibrating part 420 may receive the signal amplified by the control circuit 224 via a first conductive line 421 and vibrate according to the signal. The vibrating part 420 is a device for providing a tactile feeling to a user, and may include a wave spring. That is, the vibrating part 420 may generate a slight stroke and vibration at the same time by the wave spring formed at outer side of the periphery of the elastic part 410. For such an operation, the vibrating part 420 may require a space for vibration. According to the embodiment of the present invention, since the space is partly ensured by forming the vibrating part 420 with a wave style spring, the vibrating part 420 may function as a vibrating plate more effectively than that in the art.

The EL film layer 250 may be formed on the piezoelectric sensor film layer 230 or the actuator film layer 240 and allow the keys, including letters, numbers, and symbols, of the keypad layer 260 formed on the EL film layer 250, and the wheel of the upper case 270 to emit light. According to the embodiment of the present invention, the EL film layer 250 may be formed on the piezoelectric sensor film layer 230 or the actuator film layer 240 so that a user can use the keyboard even in the dark. Although not shown in the drawings, the EL film layer 250 may have a structure in which a transparent film, such as an ITO electrode, is disposed on a base film, such as PET, to form an ITO-PET transparent conductive film, and a fluorescent layer, a dielectric layer, and a rear electrode are stacked thereon. However, the structure of the EL film layer 250 is not limited thereto. According to the embodiment of the present invention, the EL film layer 250 of about 2.35 mm (1.7 mm in a module base) may be disposed on the actuator film layer 240 and thus may not significantly affect key sensitivity.

The actuator film layer 240 may be formed between the piezoelectric sensor film layer 230 and the EL film layer 250 and provide a cushioning feeling to a user who touches the keys. The actuator film layer 240 may be formed of a urethane film molded to include an air gap (not shown) in a portion corresponding to a key pattern in a thickness of about 0.2 mm. The urethane film has flexibility and durability. According to the embodiment of the present invention, the urethane film may be disposed below the keypad layer 260 and include a predetermined air line space (that is, an air gap). Accordingly, due to a slight stroke and a cushioning feeling by the air gap, an impact of the user's finger may be reduced, and sensitivity of the piezoelectric sensor 400 may be uniformly maintained, resulting in improvement of productivity.

The keypad layer 260 may be formed on the EL film layer 250, and the plurality of keys may be formed in a portion thereof corresponding to the key patterns. The keypad layer 260 may have a structure in which an ultraviolet (UV) film on which the plurality of keys are printed is stacked on the urethane film, and may be flexible. The keypad layer 260 may be attached to the EL film layer 250 using an adhesive or an adhesive tape. Here, the UV film configuring the keypad layer 260 may have a thickness of about 0.2 mm, and the urethane film may have a thickness of about 0.5 mm.

The upper case 270 may be formed on a periphery of the keypad layer 260 to be coupled to the lower case 210. More specifically, the upper case 270, as illustrated in FIG. 8A, may be formed in a "milky" manner and cover an EL organic layer portion disposed at a rear side of the keypad layer 260, and the periphery thereof may be combined with the lower case 210.

In addition, the upper case 270 may include the circular touch wheel 271 at a portion corresponding to the touch wheel pattern 226. An outer frame of the touch wheel 271 may be designed to emit light through a plurality of LEDs installed in the touch circuit board 220 by surface mounting technology (SMT). For example, the LED may be configured with 8 channels, and when the touch wheel 271 is touched by a user's finger, the light may become brighter to give a feeling like following the finger. In addition, an inner diameter of the touch wheel 271 may be about 41.0 mm. According to the embodiment of the present invention, the touch wheel 271 is described as having a circular shape, but is not limited thereto. The touch wheel 271 may have a polygonal shape or a variety of symbolic shapes, as well as the circular shape.

The upper case 270 may be formed of a hard material, such as a plastic or aluminum, to have a thickness of about 0.3 mm, but a material of the upper case 270 is not limited thereto.

As described above, the super-slim touch keyboard according to the embodiment of the present invention may provide excellent portability since the keyboard and the touch wheel are ultra-thin and ultra-light by being integrally formed and having a thickness of about 2.5 mm and a weight of about 200 g.

In addition, since the super-slim touch keyboard includes a piezoelectric sensor film layer and an EL film formed to be ultra-thin and ultra-light, it may provide improved tactile feeling, and allow a user to easily type even in the dark.

The super-slim smart keyboard cover device according to another embodiment of the present invention may implement a super-slim thickness by accommodating a mobile terminal and a keyboard, and perform keyboard functions while mounting the mobile terminal by opening a cover thereof according to user's purpose.

It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

What is claimed is:

1. A super-slim touch keyboard, comprising:
a lower case;
a touch circuit board including a key pattern disposed on the lower case and a touch wheel pattern disposed adjacent to the key pattern;
a piezoelectric sensor film layer formed on the touch circuit board and including a piezoelectric sensor printed on a portion thereof corresponding to the key pattern;
an electro-luminance (EL) film layer formed on the piezoelectric sensor film layer;
a keypad layer formed on the EL film layer and including a plurality of keys at a portion thereof corresponding to the key pattern; and
an upper case disposed to be coupled to the lower case at a periphery of the keypad layer and including a touch wheel at a portion thereof corresponding to the touch wheel pattern,
wherein the piezoelectric sensor comprises:
an elastic part formed in a dome shape, and configured to be deformed and restored according to a pressure applied to the plurality of keys;
a sensing part formed below the elastic part and configured to sense the pressure applied to the plurality of keys; and
a vibrating part disposed in a periphery of the elastic part and configured to vibrate when sensing a pressure applied to the plurality of keys.

2. The super-slim touch keyboard of claim 1, further comprising an actuator film layer formed between the piezoelectric sensor film layer and the EL film layer and including an air-gap at a portion corresponding to the key pattern.

3. The super-slim touch keyboard of claim 2, wherein the actuator film layer is formed of a urethane film.

4. The super-slim touch keyboard of claim 1, wherein the keypad layer is formed by stacking an ultraviolet (UV) film and a urethane film.

5. The super-slim touch keyboard of claim 1, wherein the piezoelectric sensor film layer includes polyvinylidene fluoride (PVDF).

6. The super-slim touch keyboard of claim 1, wherein the vibrating part includes a wave spring.

7. The super-slim touch keyboard of claim 1, wherein the elastic part is formed of a silicone gel.

8. A super-slim smart keyboard cover device, comprising:
- a keyboard configured to perform wired/wireless communication with a mobile terminal and input information to the mobile terminal;
- a first cover including the mobile terminal on one surface thereof;
- a second cover pivotably connected to the first cover and accommodating the keyboard; and
- a support foldably formed on the other surface opposite to the one surface of the first cover and configured to lift and support the mobile terminal at a predetermined angle,
- wherein the support is formed on the other surface of the first cover in a direction perpendicular to a longitudinal direction of the first cover, and includes a center region and first and second regions respectively extending upwardly and downwardly from the center region,
- a guiding part configured to move the support is formed on the other surface of the first cover, and
- a magnetic material is disposed inside a portion of the guiding part corresponding to the first region, the second region, and the center region.

9. The super-slim smart keyboard cover device of claim 8, wherein the support is folded in a direction distanced from the first cover at the center region, an end portion of the first region in a direction opposite to the center region is in contact with the other surface of the first cover, and the second region is distanced from the other surface of the first cover and in contact with a ground.

10. The super-slim smart keyboard cover device of claim 8, wherein the predetermined angle refers to an angle formed by the one surface of the first cover and the second cover in the range of 120 to 150 degrees.

11. The super-slim smart keyboard cover device of claim 9, wherein an end of the second region in a direction distanced from the center region is formed to be in contact with the one surface of the first cover.

12. The super-slim smart keyboard cover device of claim 9, wherein an electroplating layer preventing corrosion is formed on outer surfaces of the first region and the second region.

13. The super-slim smart keyboard cover device of claim 8, wherein an auxiliary cover portion including a housing groove configured to accommodate a battery and a PCB substrate, and a hook configured to open and close a top of the housing groove is formed on the one surface of the first cover.

14. The super-slim smart keyboard cover device of claim 13, wherein the housing groove is formed to protrude toward the other surface of the first cover in right and left directions with respect to the second region.

15. The super-slim smart keyboard cover device of claim 14, wherein the magnetic material disposed inside the guide part is arranged to be parallel to a side of the housing groove disposed at the center region and having an end portion perpendicular to the longitudinal direction thereof being disposed adjacent to the center region.

* * * * *